(12) United States Patent
Aratani et al.

(10) Patent No.: US 7,679,357 B2
(45) Date of Patent: Mar. 16, 2010

(54) CURRENT SENSOR

(75) Inventors: Masahiro Aratani, Okazaki (JP); Masato Ishihara, Anjo (JP); Seiichirou Ootake, Hazu-gun (JP)

(73) Assignee: DENSO CORPORATION, Kariya (JP)

( * ) Notice: Subject to any disclaimer, the term of this patent is extended or adjusted under 35 U.S.C. 154(b) by 181 days.

(21) Appl. No.: 11/878,324

(22) Filed: Jul. 24, 2007

(65) Prior Publication Data

US 2008/0048642 A1     Feb. 28, 2008

(30) Foreign Application Priority Data

Aug. 25, 2006  (JP) .............................. 2006-229477

(51) Int. Cl.
    *G01R 33/07*    (2006.01)
(52) U.S. Cl. .................................. 324/117 H
(58) Field of Classification Search ............. 324/117 R, 324/117 H, 126–127, 250–252
    See application file for complete search history.

(56) References Cited

U.S. PATENT DOCUMENTS

| | | | | |
|---|---|---|---|---|
| 4,972,140 A | * | 11/1990 | Okazaki et al. ......... | 324/117 H |
| 5,138,258 A | * | 8/1992 | Murata .................... | 324/207.2 |
| 5,552,700 A | * | 9/1996 | Tanabe et al. ........... | 324/117 H |
| 6,426,617 B1 | * | 7/2002 | Haensgen et al. ....... | 324/117 H |
| 7,084,617 B2 | | 8/2006 | Ozaki et al. | |
| 2002/0167301 A1 | * | 11/2002 | Haensgen et al. ....... | 324/117 H |
| 2005/0012496 A1 | * | 1/2005 | Taniguchi ............... | 324/117 R |
| 2005/0230770 A1 | | 10/2005 | Oohira | |

FOREIGN PATENT DOCUMENTS

| | | |
|---|---|---|
| JP | A-06-002563 | 1/1994 |
| JP | A-2002-296305 | 10/2002 |
| JP | A-2002-303642 | 10/2002 |
| JP | A-2004-257953 | 9/2004 |

* cited by examiner

*Primary Examiner*—Ha Tran T Nguyen
*Assistant Examiner*—Joshua Benitez
(74) *Attorney, Agent, or Firm*—Posz Law Group, PLC (57) ABSTRACT

A current sensor for measuring an electric current flowing through a conductor includes a ring shaped magnetic core, a bare semiconductor chip, and a case. The magnetic core has a gap and surrounds the conductor. The bare semiconductor chip has a front surface and a vertical Hall effect element formed on the front surface. The bare semiconductor chip is arranged in the gap of the magnetic core to detect a magnetic field generated by the electric current. The magnetic core and the bare semiconductor chip are accommodated in the case. A back surface of the bare semiconductor chip is fixed in the case in such a manner that the front surface of the bare semiconductor chip is parallel to a direction of the magnetic field.

12 Claims, 9 Drawing Sheets

CURRENT SENSOR

CROSS REFERENCE TO RELATED APPLICATION

This application is based on and incorporates herein by reference Japanese Patent Application No. 2006-229477 filed on Aug. 25, 2006.

FIELD OF THE INVENTION

The present invention relates to a current sensor.

BACKGROUND OF THE INVENTION

Figure 10A:
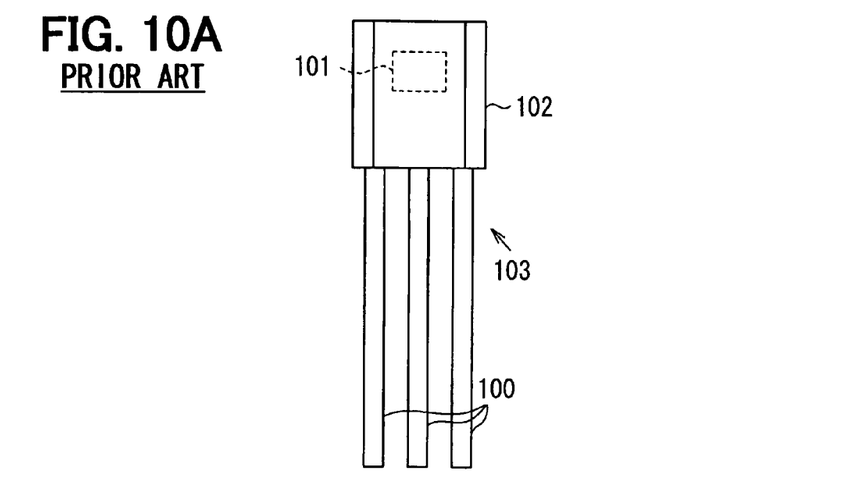
FIG. 10A is a top view of a conventional sensor package.
Figure 10B:
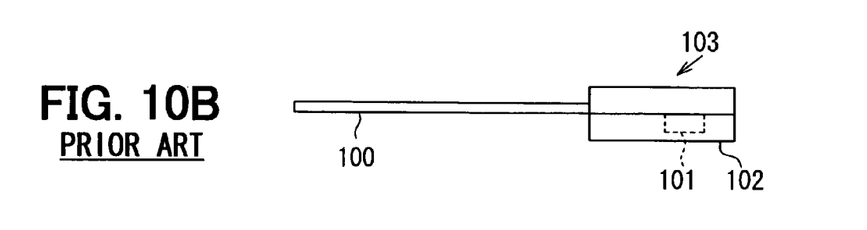
FIG. 10B is a side view of the conventional sensor package.
Figure 10C:
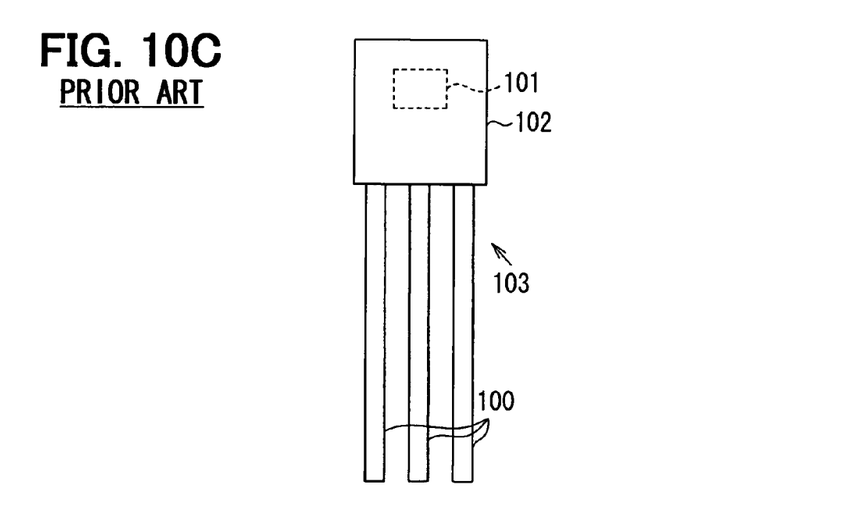
FIG. 10C is a bottom view of the conventional sensor package.

A current sensor has been proposed that measures an electric current by using a Hall effect integrated circuit (IC) made of a semiconductor material such as silicon (Si), indium arsenide (InAs), indium antimonide (InSb), or gallium arsenide (GaAs). Nowadays, a Hall effect IC, in particular, made of silicon is provided as a molded IC chip package. Specifically, as shown in FIGS. 10A-10C, a sensor chip 101 mounted on a lead frame 100 is encapsulated in a molding resin 102 so that a sensor package 103 is provided.

Figure 11:
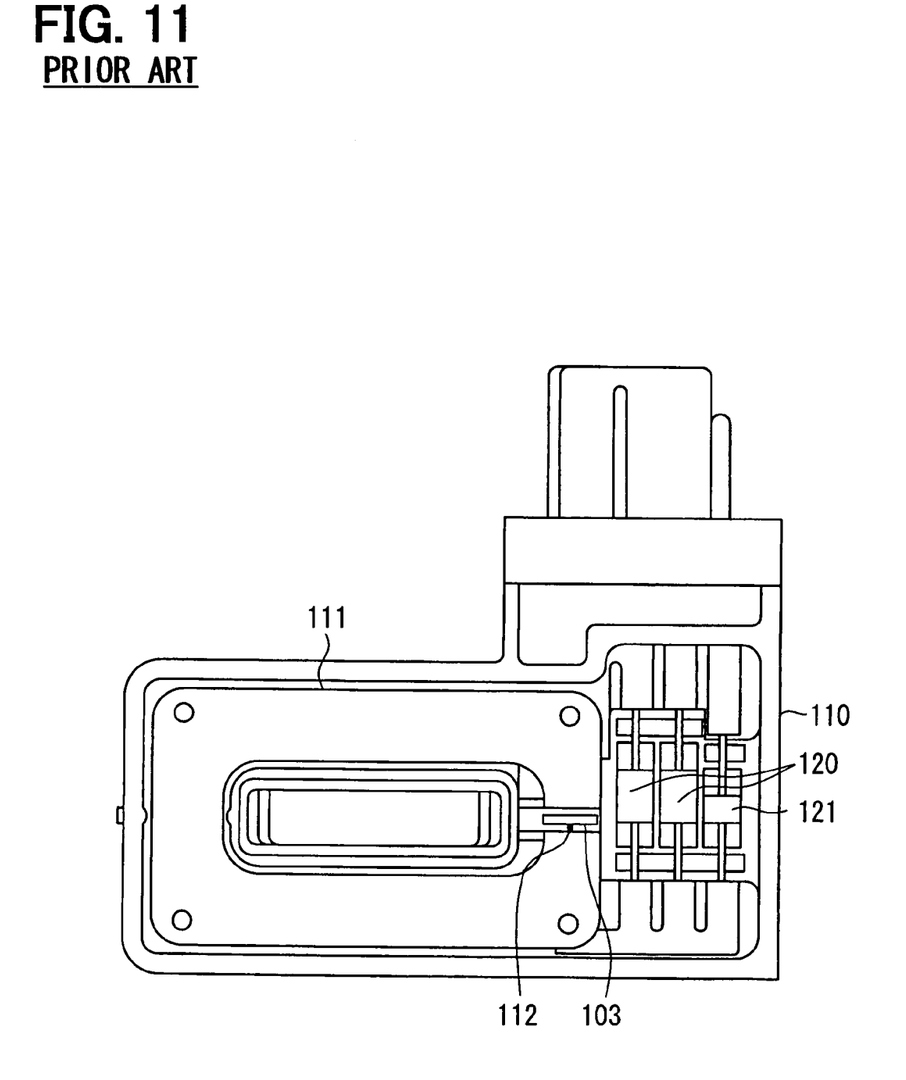
FIG. 11 is an elevation view of a conventional current sensor that employs the conventional sensor package.

A current sensor disclosed, for example, in U.S. Pat. No. 7,084,617 corresponding to JP 2005-308526 and JP 2005-308527 uses the sensor package 103. As shown in FIG. 11, the conventional current sensor includes a case 110, a magnetic core 111 accommodated in the case 110, the sensor package 103 placed in a gap 112 of the magnetic core 111, a capacitor 120 for preventing noise from entering the sensor package 103, and a thermistor 121 for temperature detection.

In such a sensor package, a Hall effect element is encapsulated with molding material such as epoxy or plastic. Therefore, the Hall effect element may be subjected to stress from the molding material, in particular, thermal stress caused by a thermal strain due to a change in temperature. The stress causes a reduction in accuracy of an output signal of the Hall effect element. Accordingly, the conventional current sensor cannot accurately measure an electric current. Further, the conventional current sensor still has room for improvement in assembly. In short, the conventional current sensor is relatively difficult to assemble.

SUMMARY OF THE INVENTION

In view of the above-described problem, it is an object of the present invention to provide a current sensor that accurately measures an electric current and assembles easily.

A current sensor for measuring an electric current flowing through a conductor includes a ring shaped magnetic core, a bare semiconductor chip, and a case. The magnetic core having a gap and surrounds the conductor. When the electric current flows through the conductor, a magnetic field generated by the electric current is concentrated by the magnetic core and appears in the gap. The bare semiconductor chip has a front surface and a vertical Hall effect element formed on the front surface. The bare semiconductor chip is arranged in the gap of the magnetic core to detect the magnetic field in the gap. The case includes a case body, a case cover, and a conductive terminal. The case body has an inner room for holding the magnetic core and the bare semiconductor chip. The case cover is attached to the case body to seal the inner room. The conductive terminal is supported in the case body. The conductive terminal has a first end exposed to the inner room and electrically connected to the bare semiconductor chip by a bonding wire and a second end exposed to outside the case body to be connectable to an external device. A back surface of the bare semiconductor chip is fixed to the inner room of the case body in such a manner that the front surface of the bare semiconductor chip is parallel to a direction of the magnetic field generated by the electric current flowing through the conductor.

The bare semiconductor chip having the vertical Hall effect element is not encapsulated with a molding material. Therefore, the vertical Hall effect element can avoid stress from the molding material so that the current sensor can accurately detect the electric current.

The bare semiconductor chip uses a vertical Hall effect element instead of a conventional lateral Hall effect element. In such an approach, the bare semiconductor chip can be arranged parallel to the direction of the magnetic field in the gap of the magnetic core. Thus, the bare semiconductor chip can be easily connected to the conductive terminal by wire bonding.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

Figure 1:
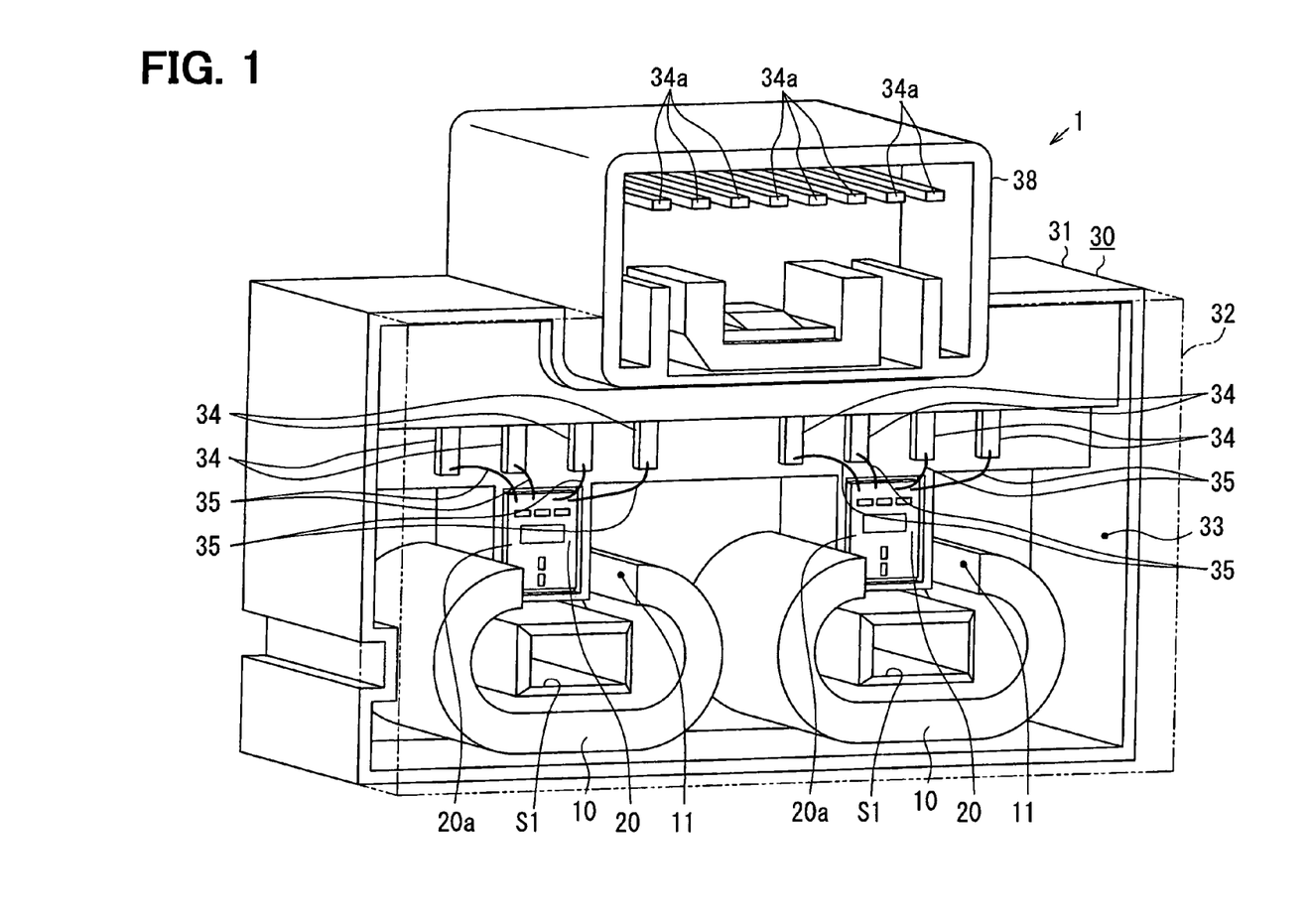
FIG. 1 is a perspective view of a current sensor according to an embodiment of the present invention.

As shown in FIG. 1, a current sensor 1 according to an embodiment of the present invention includes two sensor sets and a case 30. Each sensor set has a ring-shaped magnetic core 10 and a sensor chip 20. Each sensor set measures an electric current IF flowing through a different conductor 90. For example, each conductor 90 is connected to a different one of three outputs of an inverter (not shown) that drives a three-phase alternating-current (AC) motor for a hybrid electric vehicle (HEV) or an electric vehicle (EV). Thus, the current sensor 1 measures two of three output currents of the inverter at a time.

The magnetic core 10 and the sensor chip 20 are accommodated in the case 30. The magnetic core 10 has a gap 11 and a center opening. The magnetic core 10 may be, for example, made of a nickel iron magnetic alloy, i.e., permalloy. Specifically, the magnetic core 10 is formed by laminating multiple ring-shaped plates, each of which is made of permalloy and has a thickness of about 1 millimeter (mm).

Figure 2:
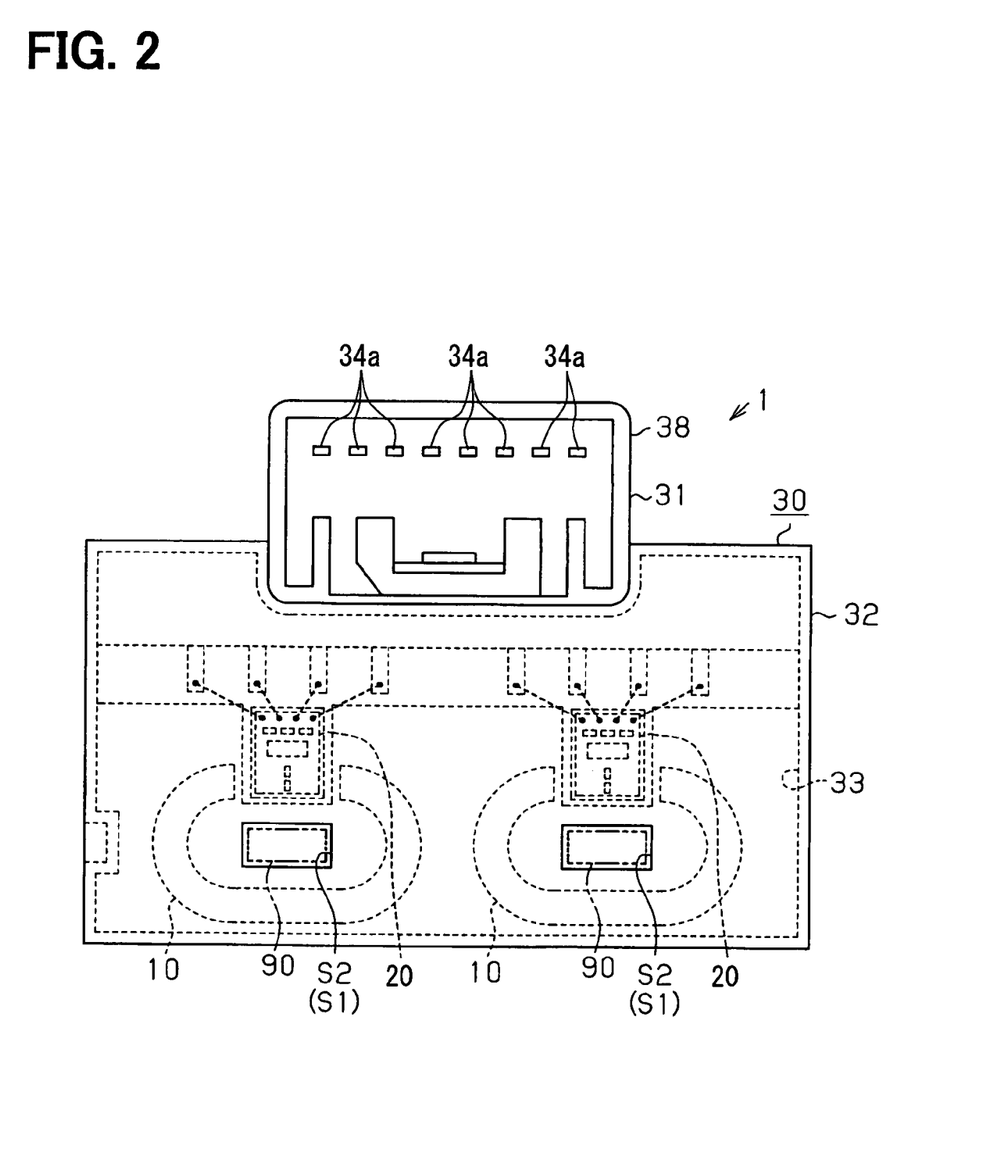
FIG. 2 is an elevation view of the current sensor a case cover of which is attached.
Figure 5:
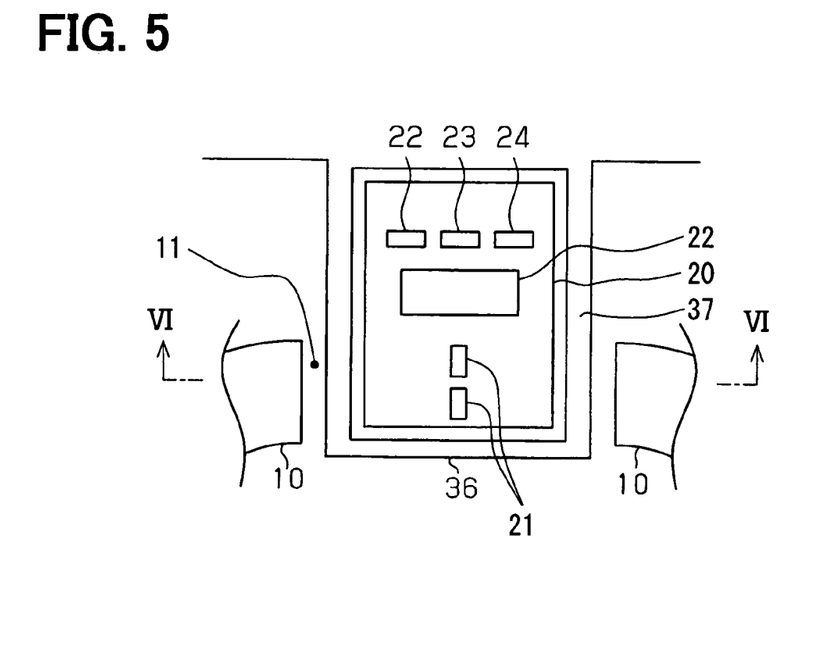
FIG. 5 is a plan view of a sensor chip arranged in a gap of a magnetic core of the current sensor.
Figure 6:
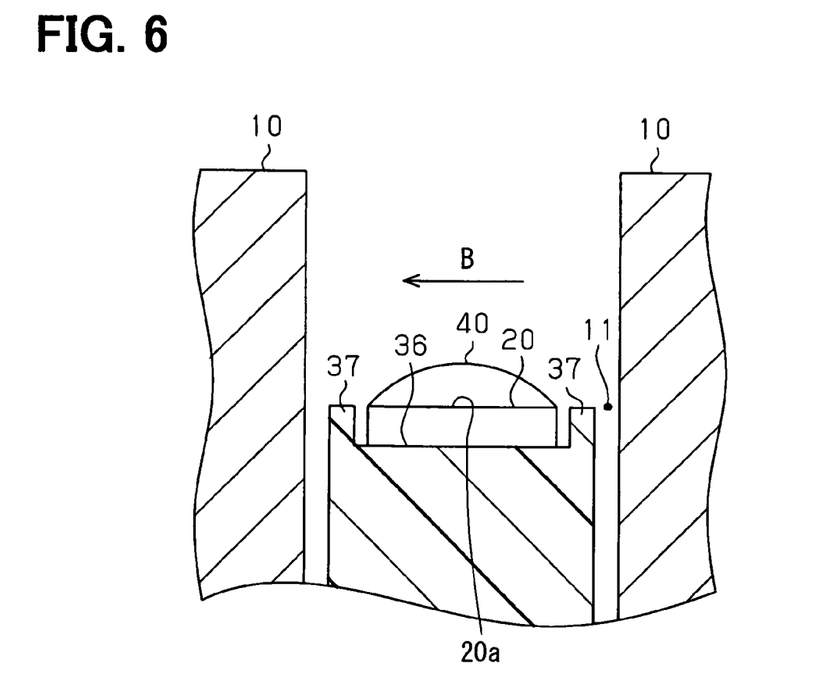
FIG. 6 is a cross-sectional view taken along line VI-VI of FIG. 5.

As shown in FIG. 2, the conductor 90 is placed in the center opening of the magnetic core 10 to be surrounded by the magnetic core 10. When the current IF flows through the conductor 90, a magnetic field generated by the current IF is concentrated by the magnetic core 10 and appears in the gap 11, as shown in FIG. 6. The strength of the magnetic field changes with the amplitude of the current IF. As shown in FIG. 5, the sensor chip 20 has two vertical Hall effect elements 21 and placed in the gap 11 to detect the magnetic field generated by the current IF.

Figure 3:
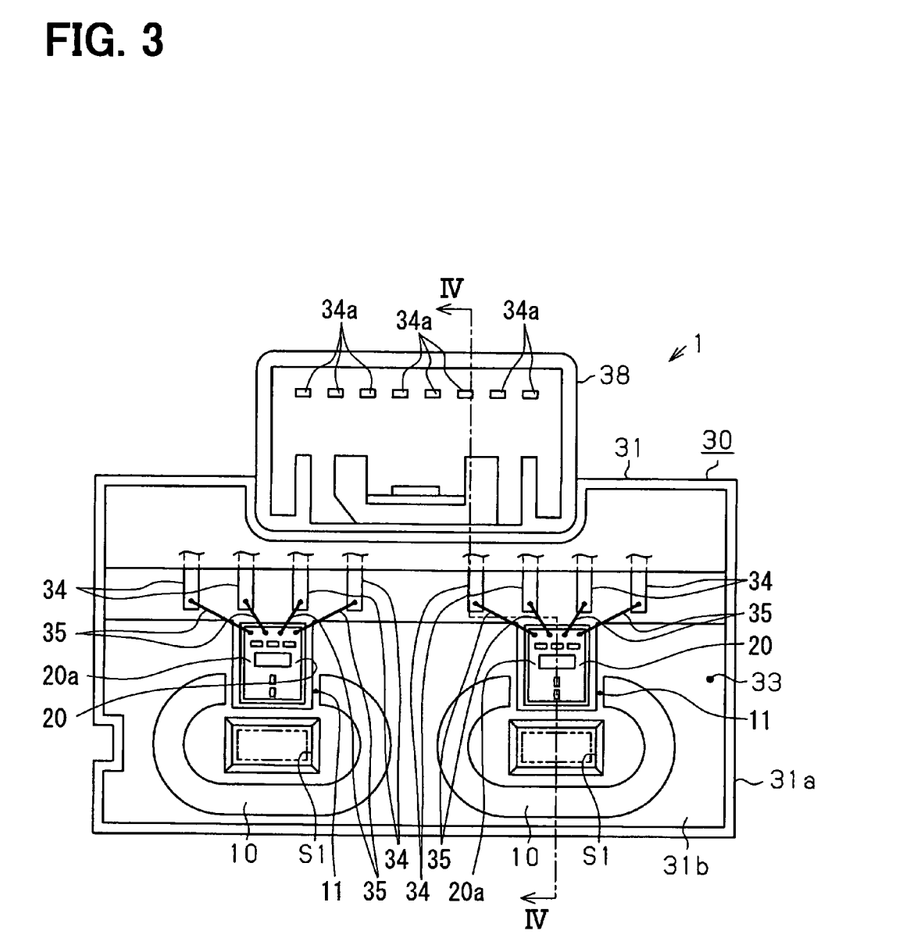
FIG. 3 is an elevation view of the current sensor the case cover of which is detached.

The case 30 includes a case body 31 and a case cover 32. As shown in FIG. 3, the case body 31 has a rectangular frame 31a and a bottom 31b. The bottom 31b is integrally formed with the rectangular frame 31a to cover a first opening defined by the frame 31a. The case cover 32 covers a second opening defined by the frame 31a so that the case 30 has a sealed inner room 33 for accommodating the magnetic core 10 and the sensor chip 20. The case cover 32 is attachable to and detachable from the case body 31. A connection terminal 34 is insert-molded with the case body 31.

The case body 31 has two through holes S1. Each conductor 90 is inserted through a corresponding one of the through holes S1. Also, the case cover 32 has two through holes S2. When the case cover 32 is attached to the case body 31, each of the through holes S2 communicates with a corresponding one of the through holes S1.

The magnetic core 10 and the sensor chip 20 are fixed to the inner room 33 of the case body 31. For example, the magnetic core 10 is fixed to the case body 31 by an adhesive (e.g., silicone adhesive), snap-fitting, or thermal welding. As shown in FIGS. 5, 6, the case body 31 has a base portion 36. The sensor chip 20 is fixed to the base portion 36 of the case body 31 in such a manner that a surface 20a of the sensor chip 20 is parallel to a direction the magnetic field in the gap 11. Unlike the sensor package 103 shown in FIGS. 10A-10C, the sensor chip 20 is a bare semiconductor chip. In short, the sensor chip 20 is not encapsulated with a molding material such as epoxy resin or plastic.

Figure 4:
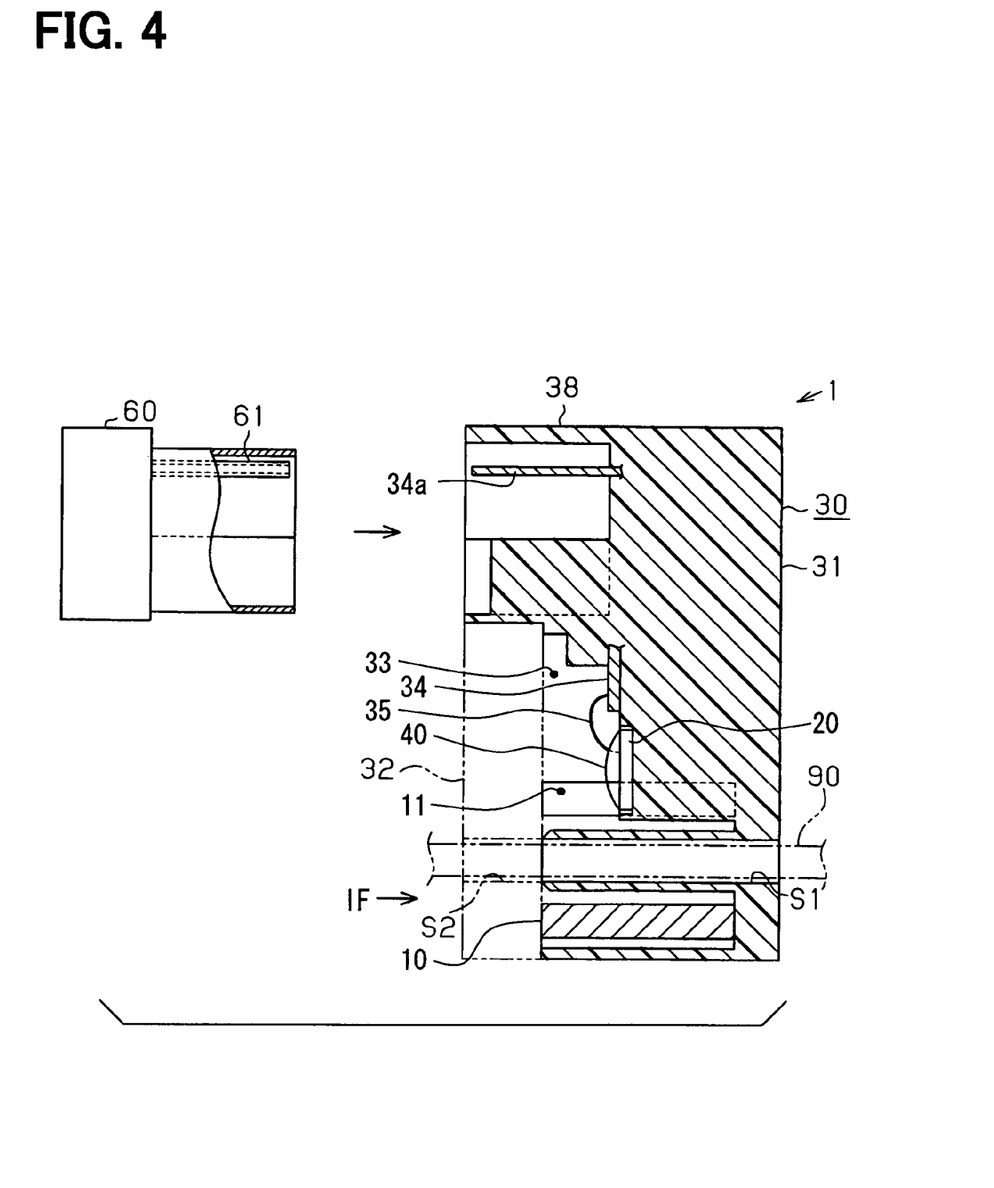
FIG. 4 is a cross-sectional view taken along line IV-IV of FIG. 3.

As shown in, for example, FIG. 4, the connection terminal 34 has a first end exposed to the inner room 33. The first end of the connection terminal 34 extends close to the sensor chip 20 to be parallel and approximately coincident with the surface 20a of the sensor chip 20. The sensor chip 20 and the first end of the connection terminal 34 are electrically connected by a bonding wire 35 made of gold, aluminum, or the like.

Before the case cover 32 is attached to the case body 31 to cover the second opening of the case body 31, the magnetic core 10 and the sensor chip 20 are placed in the inner room 33 from the side of the second opening. Then, wire bonding is performed from the side of the second opening to electrically connect the sensor chip 20 and the connection terminal 34 by the bonding wire 35. After the wire bonding is finished, the case cover 32 is attached to the case body 31. Thus, the magnetic core 10 and the sensor chip 20 can be assembled into the current sensor 1.

As shown in FIG. 5, the sensor chip 20 has a signal processing circuit 22 in addition to the vertical Hall effect elements 21 and is constructed as a Hall effect integrated circuit (IC). The signal processing circuit 22 may be, for example, formed with metal oxide semiconductor (MOS) transistors.

As shown in FIG. 4, a gel 40 is placed over the sensor chip 20 so that the sensor chip 20 is coated (i.e., sealed) with the gel 40. The gel 40 may be, for example, a silicon gel.

As shown in FIGS. 5, 6, the case body 31 has a dam portion 37 that defines the base portion 36 where the sensor chip 20 is fixed. The dam portion 37 surrounds the base portion 36 and projects with respect to the base portion 36. The dam portion 37 prevents the gel 40 from flowing out of the base portion 36, when the gel 40 is applied to the sensor chip 20. In short, the dam portion 37 limits the gel 40 within the base portion 36. Alternatively, the dam portion 37 may be recessed with respect to the base portion 36 to prevent the gel 40 from flowing out of the base portion 36.

Figure 7:
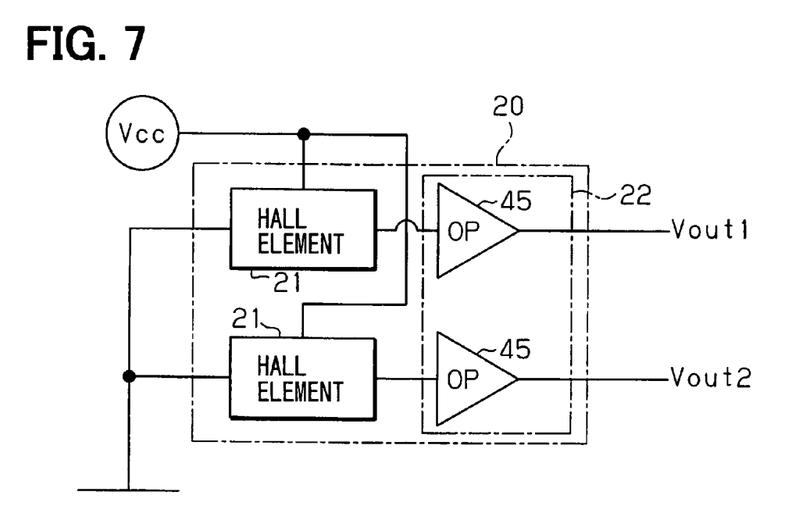
FIG. 7 is a circuit diagram of the sensor chip.

As described above, the sensor chip 20 has the two vertical Hall effect elements 21 and the signal processing circuit 22. As shown in FIG. 7, a power supply voltage Vcc is applied to each of the vertical Hall effect elements 21. The signal processing circuit 22 has two operational amplifiers 45. The operational amplifiers 45 amplify output voltages of the vertical Hall effect elements 21, respectively. The sensor chip 20 outputs the amplified voltages through output terminals Vout1, Vout2, respectively.

Figure 9A:
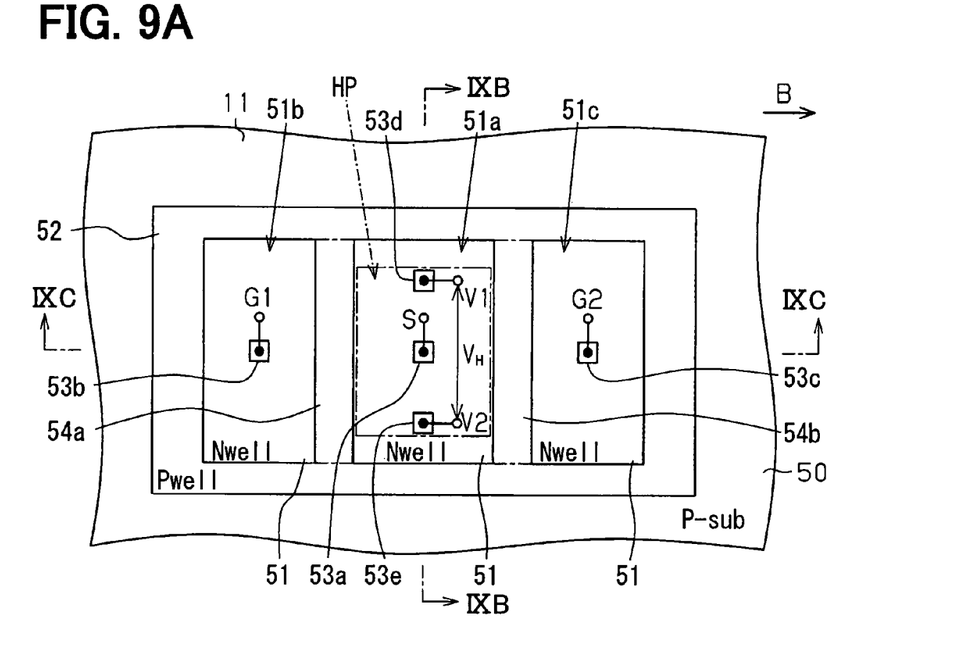
FIG. 9A is a plan view of a vertical Hall effect element formed on the sensor chip.
Figure 9B:
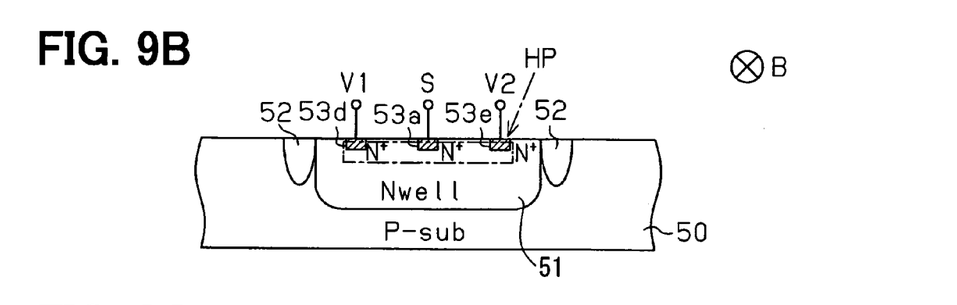
FIG. 9B is a cross-sectional view taken along line IXB-IXB of FIG. 9A.
Figure 9C:
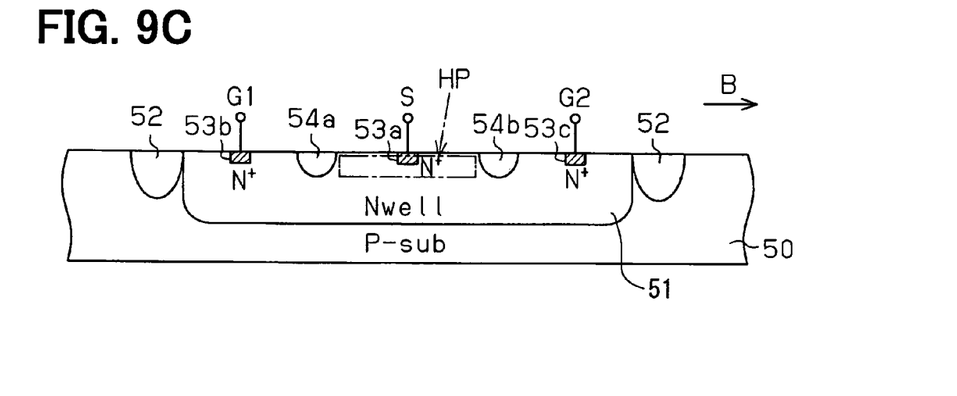
FIG. 9C is a cross-sectional view taken along line IXC-IXC of FIG. 9A.

The vertical Hall effect elements 21 are detailed in FIGS. 9A-9C. An n-type well layer 51 is formed at a surface portion of a p-type silicon substrate 50. An impurity diffusion layer 52 for element isolation is formed at the surface portion of the p-type silicon substrate 50 to surround the n-type well layer 51. N+ contact regions 53a-53e are formed at a surface portion of the n-type well layer 51. The contact regions 53a-53e are electrically connected to terminals S, G1, G2, V1, and V2, through electrodes, respectively.

P-type impurity diffusion layers 54a, 54b are formed at the surface portion of the n-type well layer 51 to divide the surface portion of the n-type well layer 51 in first, second, and third regions 51a-51c. The contact regions 53a, 53d, and 53e are formed in the first region 51a. The contact region 53b is formed in the second region 51b. The contact region 53c is formed in the third region 51c.

The contact region 53a is formed between the contact regions 53d, 53e. Further, the contact region 53a is formed between the contact regions 53b, 53c. Specifically, a line connecting the contact regions 53d, 53e perpendicularly intersects with a line connecting the contact regions 53b, 53c at the contact region 53a. The contact region 53a is opposite to the contact regions 53b, 53c across the impurity diffusion layers 54a, 54b, respectively. A region between the contact regions 53d, 53e acts as a magnetic sensing portion HP.

A control current flowing from the terminal S passes below the impurity diffusion layers 54a, 54b via the magnetic sensing portion HP and reaches the terminals G1, G2, respectively. In this case, the control current flows perpendicular to the surface of the silicon substrate 50 at the magnetic sensing portion HP. Therefore, when the magnetic field B applied to the magnetic sensing portion HP contains a component parallel to the surface of the silicon substrate 50, a Hall voltage VH appears between the terminals V1, V2 due to Hall effect. The Hall voltage VH changes with the parallel component contained in the magnetic field B. Therefore, the magnetic field B can be measured by detecting the Hall voltage VH.

As shown in FIGS. 1-4, the case 30 further includes a connector portion 38 integrally formed with the case body 31. The connector portion 38 is tube-shaped and has a bottom. A second end 34a of the connection terminal 34 is exposed to an inner surface of the bottom of the connector portion 38 to act as a male terminal. As shown in FIG. 4, when the connector portion 38 is mated with a female connector 60 of an external device, the connection terminal 34 is electrically connected to a female terminal 61 of the female connector 60. Thus, the sensor chip 20 is electrically connected to the external device.

As described above, the magnetic core 10 and the sensor chip 20 are placed in the inner room 33 from the side of the second opening of the case body 31, and the wire bonding is also performed from the side of the second opening. Thus, the magnetic core 10 and the sensor chip 20 are assembled into the current sensor 1 from the same side to facilitate the assembly of the current sensor 1. The first end of the connection terminal 34 extends close to the sensor chip 20 to be parallel and approximately coincident with the surface 20a of the sensor chip 20. As shown, for example, in FIG. 3, the sensor chip 20 is connected to the connection terminal 34 at one side by the bonding wire 35 so that there is no need to rotate the sensor chip 20 in the wire bonding. Thus, the number of manufacturing steps of the current sensor 1 can be reduced. The sensor chip 20 is a bare semiconductor chip and is not encapsulated with the molding material. Since the sensor chip 20 is subjected to no stress from the molding material, the sensor chip 20 can produce an accurate output.

Figure 8:
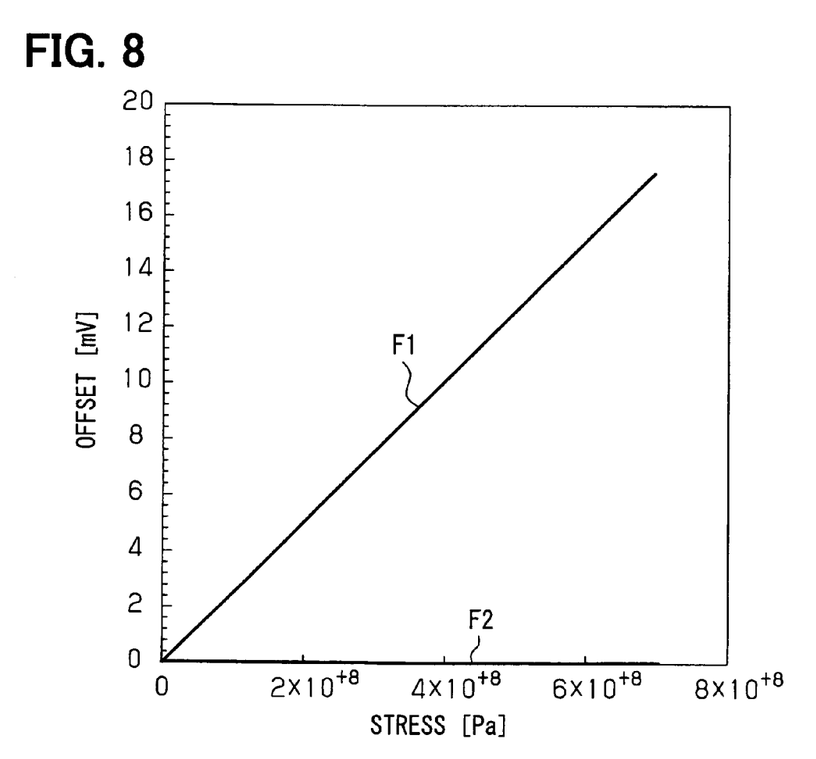
FIG. 8 is a graph showing a relationship between an off-set voltage and stress.

FIG. 8 shows a result of an experiment conducted to determine a relationship between an offset voltage of a Hall effect element and stress applied to the Hall effect element. The experiment is conducted under conditions where a temperature is 27 degrees Celsius (° C.), a control current of the Hall effect element is 1 milliampere (mA), and a magnetic field applied to the Hall effect element is 0.1 tesra (T). A first graph F1 represents a packaged conventional (i.e., lateral) Hall effect element, and a second graph F2 represents a bare vertical Hall effect element.

Whereas a vertical Hall effect element responds to a magnetic field parallel to its surface, a lateral Hall effect element responds to a magnetic field perpendicular to its surface. As can be seen from FIG. 8, when the same stress is applied to the bare vertical Hall effect element and the packaged lateral Hall effect element, an offset voltage of the bare vertical Hall effect element is smaller than an offset voltage of the packaged lateral Hall effect element.

The sensor chip 20 includes the two vertical Hall effect elements 21. As shown in FIG. 7, the two vertical Hall effect elements 21 operate independently of each other, and the sensor chip 20 has the corresponding output terminals Vout1, Vout2. Therefore, even when one of the vertical Hall effect elements 21 is broken, the sensor chip 20 can work normally. Thus, the current sensor 1 has redundancy to ensure reliability without an increase in the number of parts. Alternatively, the sensor chip 20 may include three or more vertical Hall effect elements 21 for higher redundancy. In contrast, in the case of the conventional current sensor shown in FIG. 11, two sensor packages 103 are required to be placed in the gap 112 for redundancy. The number of parts is increased, when redundancy is given to the conventional current sensor.

As shown in FIG. 5, the sensor chip 20 further includes a capacitor 23 for noise reduction (elimination) and a thermistor 24 for temperature detection. Since the capacitor 23 and the thermistor 24 are integrated in the sensor chip 20, the external capacitor 120 and the external thermistor 121 of FIG. 11 can be unnecessary. Thus, the number of parts can be reduced. Accordingly, the number of manufacturing steps can be reduced. For example, the thermistor 24 monitors deterioration of a vehicle battery by detecting a temperature of the battery.

As described above, the case 30 includes the case body 31 and the case cover 32. The case body 31 has the inner room 33 for accommodating the magnetic core 10 and the sensor chip 20 having the surface 20a, where the vertical Hall effect elements 21 are formed. The case cover 32 is attached to the case body 31 to seal the inner room 33. The sensor chip 20 is a bare semiconductor chip and is fixed to the base portion 36 in the inner room 33 in such a manner that the surface 20a is parallel to the direction the magnetic field in the gap 11. The sensor chip 20 is electrically connected to the connection terminal 34 by the bonding wire 35.

According to the embodiment, the sensor chip 20 is a bare semiconductor chip, i.e., is not encapsulated with the molding material. Therefore, the vertical Hall effect elements 21 formed on the sensor chip 20 can avoid stress from the molding material, in particular, thermal stress caused by a thermal strain due to a change in temperature. As a result, the current sensor 1 can accurately measure the electric current IF.

The sensor chip 20 uses a vertical Hall effect element instead of a conventional lateral Hall effect element. As described previously, whereas the vertical Hall effect element responds to the magnetic field parallel to its surface, a lateral Hall effect element responds to the magnetic field perpendicular to its surface. Since the sensor chip 20 uses the vertical Hall effect element, the surface 20a of the sensor chip 20 can be positioned parallel to the first end of the connection terminal 34. Therefore, it is easy to perform the wire bonding so that the current sensor 1 can assemble easily. If the sensor chip 20 uses the lateral Hall effect element, the surface 20a of the sensor chip 20 needs to be positioned perpendicular to the first end of the connection terminal 34 so that it is difficult to perform the wire bonding.

The gel 40 is placed over the sensor chip 20 so that the sensor chip 20 is coated (sealed) with the gel 40. In such an approach, the sensor chip 20 can be surely protected from moisture or the like. It is preferable that the gel 40 be a silicone gel, which has high moisture resistance and low elasticity. The dam portion 37 surrounds the base portion 36, where the sensor chip 20 is fixed. The dam portion 37 projects or is recessed with respect to the base portion 36 so that the gel 40 placed over the sensor chip 20 can be prevented from flowing out of the base portion 36.

The sensor chip 20 has multiple vertical Hall effect elements 21. In such an approach, the current sensor 1 can have redundancy without the increase in the number of parts, i.e., without an increase in size.

The case 30 includes the connector portion 38 integrally formed with the case body 31. The second end 34a of the connection terminal 34 connected to the sensor chip 20 extends to the connector portion 38 to act as the male terminal. Thus, the sensor chip 20 can be electrically connected to the external device via the connector portion 38.

The current sensor 1 has two sensor sets, i.e., two magnetic cores 10 and two sensor chips 20. Therefore, the current sensor 1 can measure two of three output currents of the inverter at a time.

The capacitor 23 and the thermistor 24 are integrated in the sensor chip 20. In such an approach, the external capacitor 120 and the external thermistor 121 of FIG. 11 can be unnecessary. Accordingly, manufacturing cost and size of the current sensor 1 can be reduced.

(Modifications)

The embodiment described above may be modified in various ways. For example, the current sensor 1 may have one sensor set and measure one of three output currents of the inverter, or the current sensor 1 may have three sensor sets and measure all the three output currents of the inverter. Alternatively, the current sensor 1 may measure electric currents other than the output currents of the inverter. The signal processing circuit 22 may be eliminated from the sensor chip 20.

Such changes and modifications are to be understood as being within the scope of the present invention as defined by the appended claims.

What is claimed is:

1. A current sensor for detecting an electric current flowing through a conductor, the current sensor comprising:
a ring shaped magnetic core having a gap, the magnetic core surrounding the conductor so that a magnetic field generated by the electric current appears in the gap;
a bare semiconductor chip arranged in the gap of the magnetic core, the bare semiconductor chip having a first surface and a vertical Hall effect element placed to the first surface;
a case including a case body, a case cover, and a conductive terminal, the case body having an inner room for accommodating the magnetic core and the bare semiconductor chip, the case cover being attached to the case body to seal the inner room, the conductive terminal being supported in the case body and having a first end exposed to the inner room; and
a bonding wire for electrically connecting the bare semiconductor chip to the first end of the conductive terminal, wherein
the first surface of the bare semiconductor chip is parallel to a direction of the magnetic field,
the conductor is one of a plurality of conductors,
the magnetic core is one of a plurality of magnetic cores,
the bare semiconductor chip is one of a plurality of bare semiconductor chips,
the case has a plurality of through holes, each of which receives a corresponding one of the plurality of conductors, and
two of the plurality of conductors are coupled to two of three outputs of an external three-phase inverter, respectively.

2. The current sensor according to claim 1, further comprising:
a gel placed over the bare semiconductor chip.

3. The current sensor according to claim 2, wherein the gel is a silicone gel.

4. The current sensor according to claim 2, wherein the case body has a base portion and a dam portion around the base portion,
a second surface of the bare semiconductor chip is fixed to the base portion, and
the dam portion limits the gel within the base portion.

5. The current sensor according to claim 4, wherein the dam portion projects or is recessed with respect to the base portion.

6. The current sensor according to claim 1, wherein the vertical Hall effect element is one of a plurality of vertical Hall effect elements.

7. The current sensor according to claim 1, wherein the case further includes a connector portion unitary with the case body, and
a second end of the conductive terminal extends to the connector portion.

8. The current sensor according to claim 1, wherein the bare semiconductor chip further has a capacitor for noise reduction.

9. The current sensor according to claim 1, wherein the bare semiconductor chip further has an element for temperature detection.

10. The current sensor according to claim 1, wherein the first surface of the bare semiconductor chip is parallel to a circumference of the magnetic core.

11. The current sensor according to claim 1, wherein the bare semiconductor chip comprises an unencapsulated semiconductor chip.

12. A current sensor for detecting electric currents flowing through a plurality of conductors, the current sensor comprising:
a plurality of ring shaped magnetic cores each having a gap, the plurality of ring shaped magnetic cores respectively surrounding a plurality of conductors, the plurality of conductors each having an electric current flowing therethrough and generating a magnetic field that appears in the gap of a corresponding one of the respective plurality of ring shaped magnetic cores;
a plurality of bare semiconductor chips each arranged in the gap of one of the plurality of ring shaped magnetic cores, the plurality of bare semiconductor chips each having a first surface that is parallel to a direction of the magnetic field and a vertical Hall effect element placed to the first surface;
a case including a case body, a case cover, a plurality of conductive terminals and a plurality of through holes, each of which receives a corresponding one of the plurality of conductors, the case body having an inner room for accommodating the plurality of magnetic cores and the plurality of bare semiconductor chips, the case cover being attached to the case body to seal the inner room, the plurality of conductive terminals being supported in the case body and each having a first end exposed to the inner room; and
a plurality of bonding wires for respectively electrically connecting the plurality of bare semiconductor chips to the first ends of the plurality of conductive terminals, wherein
two of the plurality of conductors are coupled to two of three outputs of an external three-phase inverter, respectively.

* * * * *